United States Patent [19]

Nakazaki et al.

[11] Patent Number: 4,790,186
[45] Date of Patent: Dec. 13, 1988

[54] DEVICE FOR MOUNTING A TERMINAL TO AN ELECTRIC INDICATOR

[75] Inventors: Youji Nakazaki; Yoshio Isobe, both of Shimada, Japan

[73] Assignee: Yazaki Corporation, Japan

[21] Appl. No.: 44,283

[22] Filed: Apr. 30, 1987

[30] Foreign Application Priority Data

Apr. 30, 1986 [JP] Japan .............................. 61-64244[U]
Apr. 30, 1986 [JP] Japan .............................. 61-64245[U]
Apr. 30, 1986 [JP] Japan .............................. 61-64248[U]

[51] Int. Cl.$^4$ ........................ G01D 3/08; G01D 11/00; G01D 13/00
[52] U.S. Cl. ..................................... 73/431; 73/866.1; 340/691
[58] Field of Search ............... 73/866.1, 431; 340/691, 340/693

[56] References Cited

U.S. PATENT DOCUMENTS

| | | | |
|---|---|---|---|
| 3,960,019 | 6/1976 | Jakabsen | 73/431 X |
| 4,055,141 | 10/1977 | Hums | 73/431 X |
| 4,090,467 | 5/1978 | Joesting | 73/866.1 X |
| 4,169,381 | 10/1979 | Skopil | 73/431 X |

Primary Examiner—Tom Noland
Attorney, Agent, or Firm—Wigman & Cohen

[57] ABSTRACT

A device for mounting a terminal to an electric indicator includes a meter body of the electrical indicator including electric wiring connected to the electrical terminal and a through hole, a gauge support plate of the electric indicator made of electrically insulating material and disposed on the meter body, and the gauge support plate having at least one concavity to which the electrical terminal is mounted, a screw, which is inserted from beneath the meter body via the through hole, for fastening the terminal to the gauge support plate, and a mechanism for preventing an occurrence of a deformation and deviation in said gauge support plate by the fastening of the screw. The mechanism includes a terminal holder for receiving the electrical terminal therein and supporting members for suspensionally supporting the terminal holder, or a pointed pin provided on the meter body and a notch provided in the terminal which is in engagement with the pin. Thereby, it is possible to prevent an occurrence of error of the indicator due to the deformation or deviation.

29 Claims, 6 Drawing Sheets

DEVICE FOR MOUNTING A TERMINAL TO AN ELECTRIC INDICATOR

BACKGROUND OF THE INVENTION

Field of the Invention

This invention relates to a device for mounting a terminal to an electric indicator, and more particularly to a terminal mounting device having a construction which can prevent the occurrence of a displacement and deformation in a gauge support plate of the indicator when the terminal is mounted to the indicator with a screw, thereby preventing the occurrence of an indication error in the indicator.

Description of the Prior Art

Figure 1:
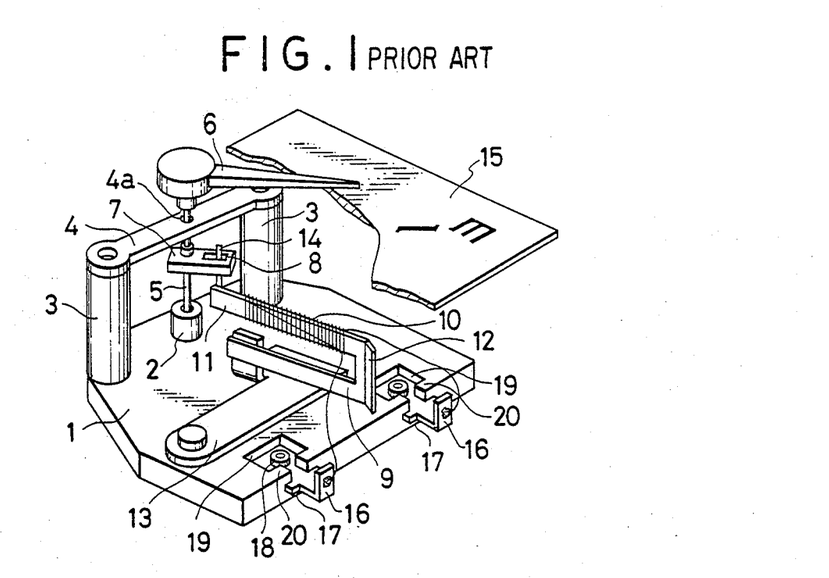
FIG. 1 is a perspective view showing a schematic construction of a prior art indicator.
Figure 2:
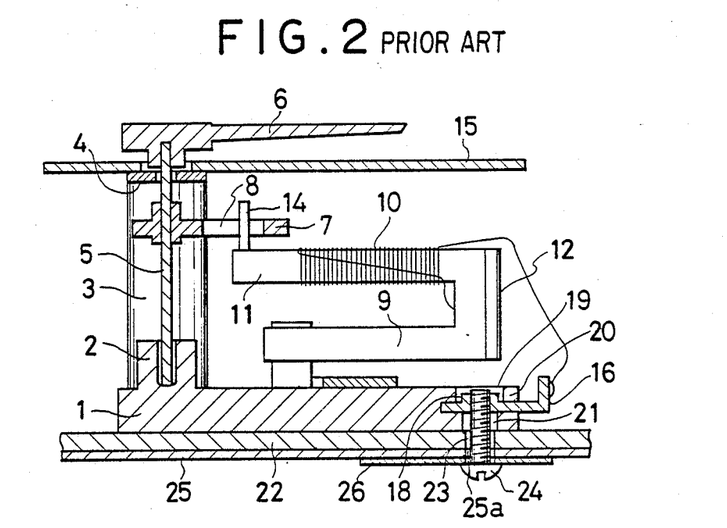
FIG. 2 is a sectional view of the indicator of the prior art.
Figure 3:
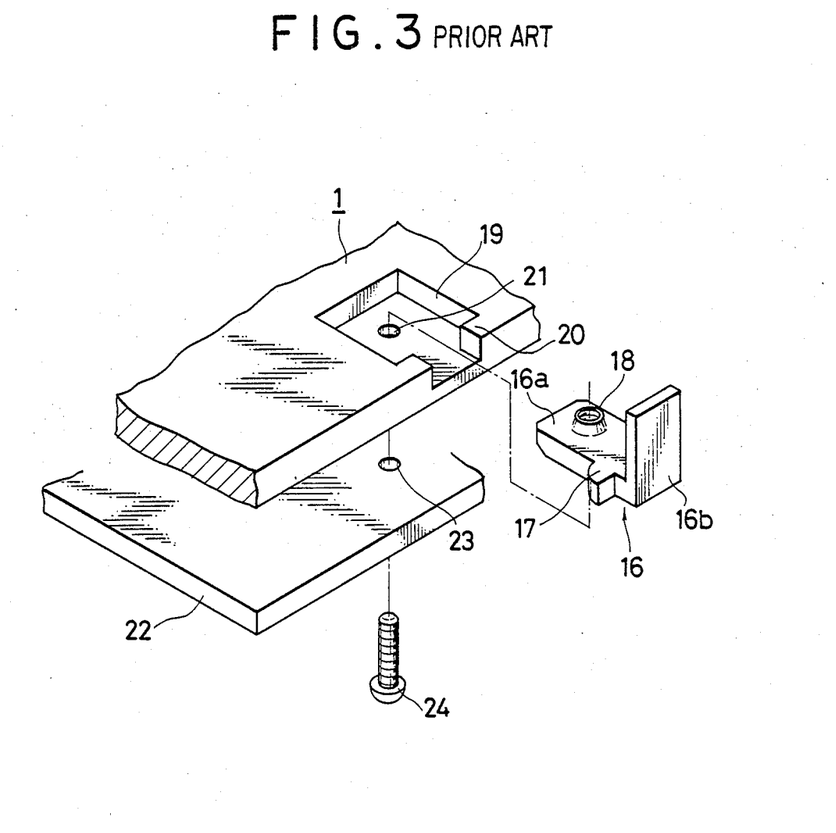
FIG. 3 is exploded perspective view of the part of the prior art indicator wherein terminals are attached.

Conventionally, a terminal is mounted to an electric indicator in the manner illustrated in FIGS. 1 to 3.

The figures show a fuel gauge for a motor vehicle. The fuel gauge includes a gauge support plate 1 made from an electrically insulating material. On the gauge support plate 1, there is provided a bottom bearing 2. In addition, on both sides of the bottom bearing 2, two dial support poles 3 are located, between which is spanned a support plate 4. The lower end of a pointer shaft 5 is axially supported on the bearing 2, and the upper end of the pointer shaft 5 is axially rotatably supported by being inserted through a small hole 4a which is formed in the support plate 4.

The upper end of the pointer shaft 5 is inserted under pressure into a pointer 6, and a lever 7 with a slit 8 formed on it is fixed at the midpoint of the pointer shaft 5. An U-shaped bimetal 12 is formed by a temperature compensating section 9 and a movable leg 11 with a heating wire 10 wound around it. One end of the temperature compensating section 9 is fixed to an adjusting plate 13 which is attached to the gauge support plate 1. Further, a pin 14 is attached by welding to the tip of the movable leg 11 on which the heating wire 10 is wound, and the pin 14 is slidably engaged with the slit 8 in the lever 7. The lever 7 is turned by the bending of the movable leg 11 of the bimetal 12 in response to the amount of heat generated by the heating wire 10, and the pointer 6 is arranged to indicate the scales on a dial 15 which is fixed on the dial support sections 3.

In the fuel gauge, on the edge of the gauge support plate 1 made of an electrically insulating material, there are formed two cavities 19 to which a terminal 16 is attached, respectively. One of each of the ends of the heating wire 10 of the bimetal 12 is connected to one of the terminals 16, respectively.

As shown in FIG. 3, the terminal 16 includes an inserting section 16a and a wire connecting section 16b. A pair of engaging projections 17 are provided on both sides of the inserting section 16a of the terminal 16, respectively. In addition, at the center of the inserting section 16a, there is formed a screw fitting section 18. protruded from the inner peripheral wall of the cavity 19, there are formed engaging sections 20 for preventing the dropping of the terminal 16 through engagement with the projections 17 of the terminal 16. Also, on the bottom surface of the cavity 19 of the gauge support plate 1, there is formed a through hole 21 which corresponds to the screw fitting section 18 of the terminal 16. Under the gauge support plate 1, a meter body 22 which encloses the electrical indicator is provided. The meter body 22 has two through holes 23 which also correspond to the locations of the screw fitting sections 18, respectively. As illustrated in FIG. 2, under the meter body 22, there is provided a wiring board 25 connected to an electrical source (not shown), which also has two through holes 25a corresponding to the locations of the screw fitting sections 18, respectively. A screw 24 which is inserted via a washer 26 and the through holes 21, 23 and 25a beneath the wiring board 25, is engaged with the screw fitting section 18 of the terminal 16 to allow the connection between the terminal 16 and the gauge support plate 1, whereby an electrical circuit between the electrical source and the terminals 16 is completed.

However, in mounting the terminal 16 to the indicator in the above-described fashion with the screw 24, there sometimes occurred errors in the gauge indication of the electric indicator. The errors are caused by a displacement and deformation in the gauge support plate 1, the meter body 22 and the wiring board due to a tightening force of the screw 24. For example, such errors may result from deviations in the positioning between the through hole 21 of the gauge support plate 1, the through hole 23 of the meter body 22, or the through hole 25a in the wiring board 25 and the screw fitting section 18 of the terminal 16, or from a gap between the gauge support plate 1 and the meter body 22.

In addition, errors may be generated in the gauge indication of the indicator which are caused by the deformation due to twisting, along with the terminal, of the gauge support plate 1 caused by a tightening force of the screw 24, since little clearance is provided between the terminal and the inner surface of the cavity 19.

SUMMARY OF THE INVENTION

In view of the foregoing limitations and shortcomings of the prior art devices, as well as other disadvantages not mentioned specifically above, it is a primary object of the present invention to provide a device for mounting a terminal to an electric indicator which is capable of fixing the terminal to a gauge support plate by a screw without causing a displacement and deformation in the gauge support plate and meter body.

Another object of the present invention is to provide a device for mounting a terminal to an electric indicator which is capable of preventing the occurrence of error in the indicator caused by the displacement and deformation in the gauge support plate.

A further object of the present invention is to provide a device for mounting a terminal to an electric indicator which even if an unfavorable twisting force is caused by a fastening force of the screw due to the presence of a deviation between the gauge support plate and meter body, it is possible to absorb such deviation by the device without influencing the gauge indication of the indicator.

A further object of the present invention to provide a device for mounting a terminal to an electric indicator which can reduce the deviation between a meter body and terminal, thereby preventing an undesirably displacement and deformation in the gauge support plate caused by the twisting force of the screw fastening.

In order to attain the above objects, a device for mounting a terminal to an electric indicator according to the present invention comprises a meter body of said electric indicator including electric wiring means connected to the terminal, a gauge support plate of the electric indicator made of electrically insulating material and disposed on said meter body, and said gauge support plate having at least one concavity at one end portion thereof at which the terminal is provided, a screw for fastening the terminal to the gauge support plate, and means for preventing the occurrence of a deformation and displacement in said gauge support plate caused by said fastening of the screw, thereby preventing an occurrence of an error in indication of the indicator due to the deformation and displacement. Said preventing means further comprises a terminal holder for receiving the terminal therein which is made of electrically insulating material, the size of said terminal holder being smaller than that of said concavity so that said terminal is received within said concavity through a space therebetween, and at least one supporting means for suspensionally supporting the terminal holder within the concavity. Further, said preventing means comprises positioning means for regulating a positioning of the terminal which includes a pin provided on the meter body, and a notch provided in the electrical terminal and having a shape to that of said pin so as to engage one another. Furthermore, said preventing means comprises a gap provided between the inner wall of the cavity of the terminal holder and the outer periphery of the terminal, said gap being formed by making the size of the cavity relatively larger than that of the terminal.

Accordingly, in the terminal mounting device having the above-described construction, during the fastening of the screw, since twisting caused by the fastening force of the screw is absorbed by the twisting by the support means and not transmitted to the terminal holder, the gauge support plate itself will not experience a displacement and deformation resulting from the twisting force, so that there is reduced likelihood of generating an indication error of the gauge that is provided on the gauge support plate. In other words, since the terminal holder is supported to the gauge support plate suspensionally by means of the support means, the twisting force will not cause any displacement and a deformation to the gauge support plate. Further, even if there exists a deviation between the gauge support plate and the meter body, the twisting caused by the fastening force can be absorbed by the support means without generating a deformation or displacement in the gauge support plate. Furthermore, since said positioning means is provided, a deviation between the gauge support plate and meter body when assembled is reduced whereby it is possible to prevent an occurrence of a deformation and displacement in the gauge support plate. Moreover, it is possible to prevent a rotation of the terminal caused by the rotational force of the screw when the screw is fastened. In addition, since the gap is provided between the periphery of the electrical terminal and the inner wall of the cavity of the terminal holder or the inner wall of the concavity of the gauge support plate, the twisting force can also be absorbed by the displacement of the terminal within the gap.

These and the other objects and advantages of the present invention, as well as the details of an illustrative embodiment, will be more fully understood from the following specification and drawing, in which;

DETAILED DESCRIPTION OF THE PREFERRED EMBODIMENT

Figure 4:
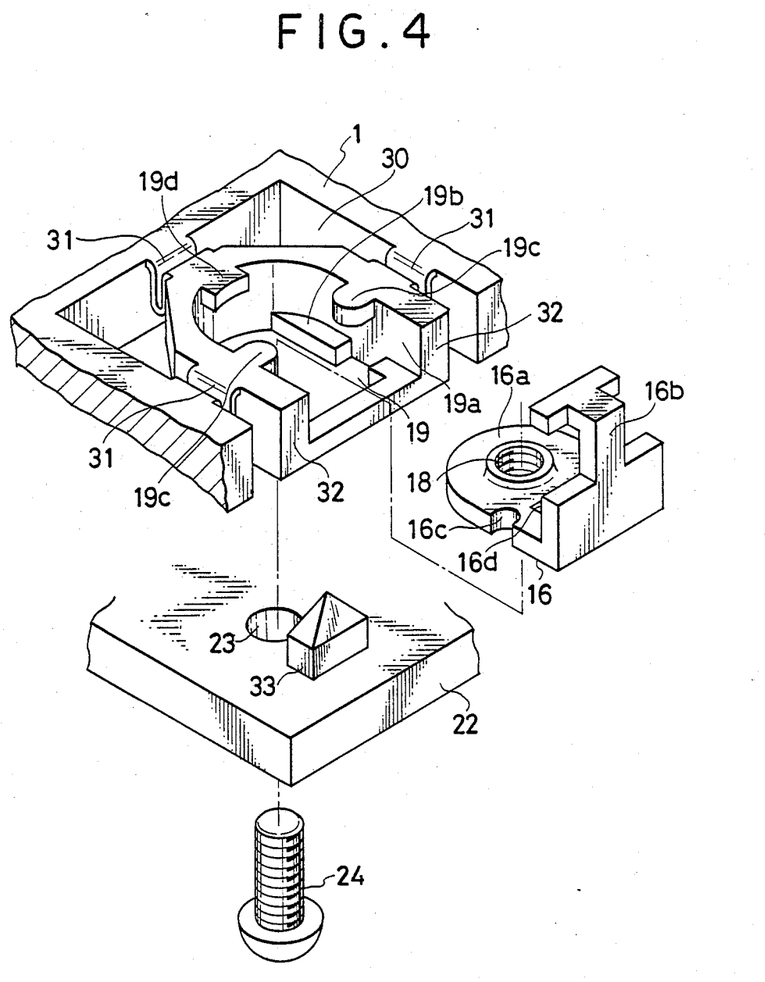
FIG. 4 is a perspective assembly view of a principal part of the first embodiment of a terminal mounting device according to the present invention.

Referring now in detail to the drawings wherein like parts are designed by like reference numerals throughout, there is illustrated in FIG. 4 a device for mounting a terminal to an electric indicator in accordance with the present invention FIG. 4 is a perspective assembly view of an important part of an embodiment of the present invention, which shows a terminal mounting device provided in a gauge support plate 1. Although not shown in the drawing, of course, mechanisms for an indicator such as a pointer, a bimetal, and a gauge plate and the like are provided on the gauge support plate 1 in the same manner as the prior art indicator.

The terminal mounting device comprises a concavity 30 formed at an edge portion of the gauge support plate 1 and a terminal holder 32. The terminal holder 32 has a substantially U-shaped body, the size of which is relatively smaller than that of the concavity 30. The terminal holder 32 is held at three points by three elastic members 31 so as to be suspended in the concavity 30. The elastic members 31 with a sectional form of a thin plate which is bent to a substantial U-shape, are formed of a synthetic resin material in a unitary body together with the terminal holder 32 and the gauge support plate 1.

The terminal holder 32 has a cavity 19 for accommodating the terminal therein, which has an inner wall 19a defining the cavity 19. The upper part, lower part, and one side of the cavity 19 are cut open. The terminal 16 is arranged to be held by being interposed between a pair of shelves 19b which are formed in the lower part of the inner wall 19a, a pair of engaging pieces 19c which are formed on both sides in the upper part of the inner wall 19a, and a pressing piece 19d.

The terminal 16 which is made of a conductive material includes an inserting section 16a and a wire connecting section 16b provided on the rear end of the insertion section 16b. The external form of the inserting section 16a is similar to that of the cavity 19 with somewhat smaller size. A heating wire 10 wounded on the bimetal is connected to the wire connecting section 16b. A screw fitting section 18 is provided at the center of the inserting section 16a, and a pair of notches 16c are provided on both sides thereof. In addition, a position regulating section which consists of a rectangular notch 16d is situated between the base of the wire connecting section 16b and the screw fitting section 18.

The meter body 22 which encloses the electric indicator is disposed under the gauge support plate 1. In the meter body 22, there are provided a through hole through which the screw 24 is inserted to be screwed into the screw fitting section in the terminal 16 and a pin 33 for regulating positioning the terminal 16, which can be engaged with the rectangular notch 16d of the terminal 16.

Figure 5:
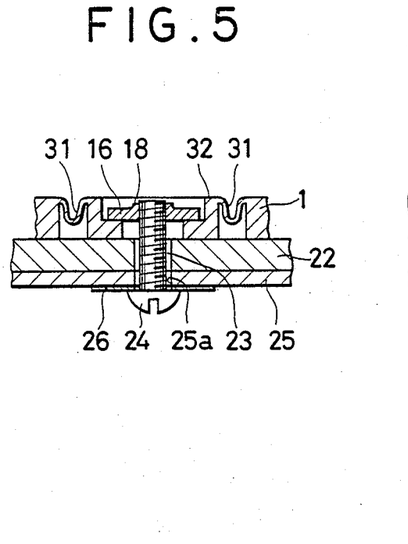
FIG. 5 is a sectional view of the principal part of FIG. 4.

FIG. 5 shows a transverse sectional view of the terminal mounting device. As shown in the drawing, under the gauge support plate 1, there is disposed the meter body 22, and thereunder the printed wiring board 25 which is connected to an electrical source (not shown) is provided. The printed wiring board 25 also has a through hole 25a, so that the screw 24 is inserted through a washer 26, and the through holes 25a and 23, and is screwed into the screw fitting section 18 in the terminal 16. This construction is same as that of the prior art.

Namely, the screw 24 which is inserted from beneath penetrating the gauge support plate 1, meter body 22, and printed wiring board 25, and so on, is engaged, through the opening in the lower part of the terminal holder 32, with the screw fitting section 18 of the terminal 16, thereby holding the terminal 16 within the cavity 19. In this case, the terminal holder 32 is supported by the elastic members 31 to be movable in the vertical as well as in the horizontal directions, so that the holder 32 can be left unaffected by a twisting force caused by a fastening force of the screw 24 since the twisting force is absorbed by the elastic members 31.

Figure 6:
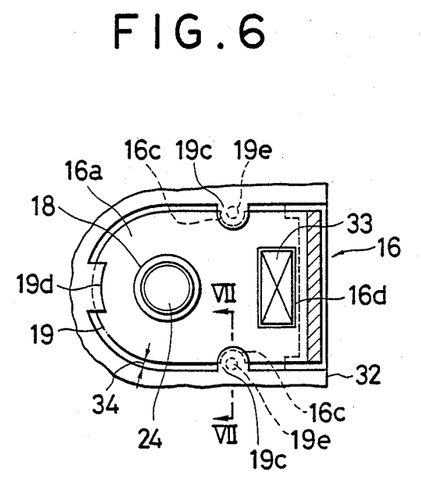
FIG. 6 is a plan view of the terminal mounting device.
Figure 7:
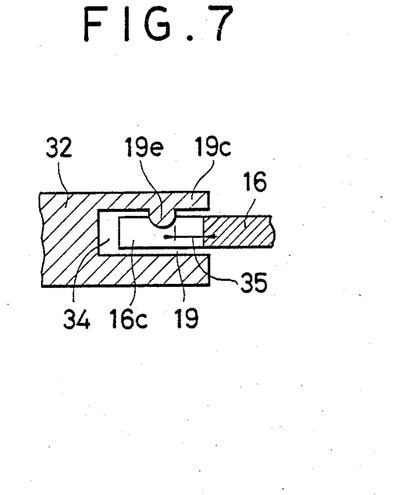
FIG. 7 is a partly sectional view of the terminal mounting device, which shows a state in which a projection of a terminal holder is engaged with a concavity of the terminal.

FIG. 6 shows a plan view of the terminal mounting device. As stated above, the external form of the terminal is similar to that of the cavity 19 with somewhat smaller size. Consequently, as may be seen from the figure, there is created some gap 34 between the outer periphery of the terminal 16 and the inner peripheral wall 19a of the cavity 19, when the inserting section 16a of the terminal 16 is accommodated in the cavity 19. In addition, a similar gap also exists between the notches 16c and the engaging pieces 19c for preventing the slippage of the inserting section 16a of the terminal 16 from the cavity 19, respectively. Specifically, each engaging piece 19c has a semispherical protuberance 19e on its bottom surface as shown in FIG. 7, so that there is created a gap 35 between the protuberance 19e and the periphery of the notch 16c.

The width of these gaps 34 and 35 is preferred to be less than the diameter of the screw 24 or one-half of the inner diameter d of the screw fitting section 18. This means that the screw 24 is of pointed type, so that since even if there exists some mismatch between the positions of the screw 24 and the screw fitting section 18, upon a screw fitting of the screw 24, the terminal 16 can be moved by its automatic sliding in the cavity 19 within the range of engagement.

Figure 8:
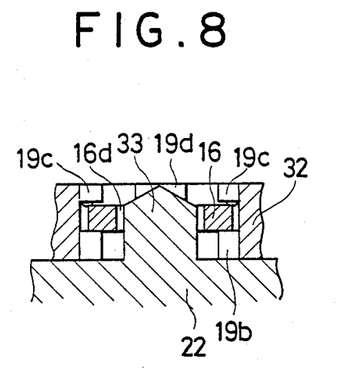
FIG. 8 is a partly sectional view showing a state in which a pin in a meter body is engaged with a notch in the terminal.

FIG. 8 shows a sectional view of the engaging state between the notch 16d of the rotation regulating section of the terminal 16 and the pin 33 as a rotation regulating projection which is integrally provided with the meter body 22. As may be seen from the figure, the notch 16d has a rectangular shape which is similar to the sectional shape of the pin 33, therefore both are fitted relating tight each other. Accordingly, when the screw 24 is engaged, turning of the terminal 16 can be prevented, and further, the terminal 16 can be positioned and fixed temporarily directly to the meter body 22, thereby a deviation between the gauge support plate 1 and meter body 22 is reduced.

Next, the procedure of fitting the terminal 16 to the indicator will be described.

In mounting the terminal 16 to the terminal holder 32, the semicircular tip section of the inserting section 16a of the terminal 16 is first inserted into the cavity 19 from the opening on the side. In so doing, the engaging pieces 19c each having the semispherical projection 19e are lifted upward somewhat while permitting the advancement of the terminal 16, with the projections 19e sliding relatively over the upper surface of the inserting section 16a of the terminal 16. In this case, since the projections 19e are semicircular, the terminal 16 will not be damaged. When the terminal 16 is inserted sufficiently deeply, the projections 19e are anchored to the notches 16c of the terminal 16. Then, the terminal 16 is prevented from dropping and is held stably in a state interposed vertically by the shelves 19b, pressing piece 19d, and engaging pieces 19c.

Next, by placing the gauge support plate 1 having the terminal holder 32 on the meter body 22 and printed wiring board 25, engaging the pin 33 formed on the meter body 22 to the rectangular notch 16d, inserting the screw 24 from beneath the printed wiring board 25, and fastening the screw 24 to the screw fitting section 18 of the terminal 16, the terminal can be fixed securely in the cavity 19 of the terminal holder 32.

In this case, the terminal 16 can properly be positioned by the engagement between the pin 33 and the rectangular notch 16d so that the deviation in the positioning between the through hole 23 of the meter body 22 and the screw fitting section 18 of the terminal 16 is limited to a small quantity. In addition, the rotational movement of the terminal can also be prevented by the engagement between pin 33 and the notch 16d. Further, because of the presences of the gap 34 between the outer periphery of the terminal 16 and the inner wall 19a of the cavity 19, and the gap 35 between the projections 19e and the notches 16c, even if there is a mismatch in the positions of the through hole 23 of the meter body 22 and the screw fitting section 18 of the terminal 16, such a mismatch can be absorbed due to free movement of the terminal within the gaps.

Accordingly, during the fastening of the screw 24, the cavity 19 of the terminal holder 32 will receive no twisting force. Consequently, the gauge support plate 1 itself will not receive an undesirable displacement and deformation caused by the twisting force, so that there will be a reduced likelihood of generating an indication error of the gauge that is provided on the gauge support plate 1. Moreover, the terminal holder 32 is supported by the gauge support plate 1 by means of the elastic members 31 so that a twisting force that will be applied to the cavity 19 can also be absorbed by the elastic members 31. In addition, even if there exists a disparity in the thickness of the gauge support plate 1 or the receiving height of the meter body 22 on which the gauge support plate 1 is placed, such a disparity can be absorbed by the elastic members 31, without generating a deformation and displacement in the gauge support plate 1.

Further, according to the present invention, the terminal mounting device has the positioning regulating means including the pointed pin 33 provided on the meter body 22 and the notch 16d with which the pin is engaged. Accordingly, the positions of the screw fitting section 18 of the terminal 16 and the screw through hole 23 of the meter body 22 can be directly regulated between the terminal 16 and the meter body 22, without influencing the gauge support plate 1. Further, even if there is generated a position deviation, the terminal 16 can move in the cavity 19 to the extent of the gaps 34 and 35, so that there will occur no displacement and deformation in the gauge support plate 1 during screw fastening, thereby making it possible to hold the gauge indication with high precision.

In disassembling the device for repair, after removing the screw 24 and dismounting the gauge support plate 1 from the meter body 22, the terminal 16 can be taken out by forcibly pulling out the terminal 16 from the cavity 19 which will disengage the projections 19e from the notches 16c.

In the foregoing, description was given in conjunction with the case in which the curved elastic pieces 31 are formed of a synthetic resin in a unitary body with the terminal holder 32 and the gauge support plate 1. However, the elastic members need not be limited to such a case, and may be constructed using other members such as rubber material and metallic springs.

Further, the pin 33 for preventing turning of the terminal and the notch 16d which engages with the pin 33 need not be rectangular in form, and may suitably be modified to circular or other various forms.

Figure 9:
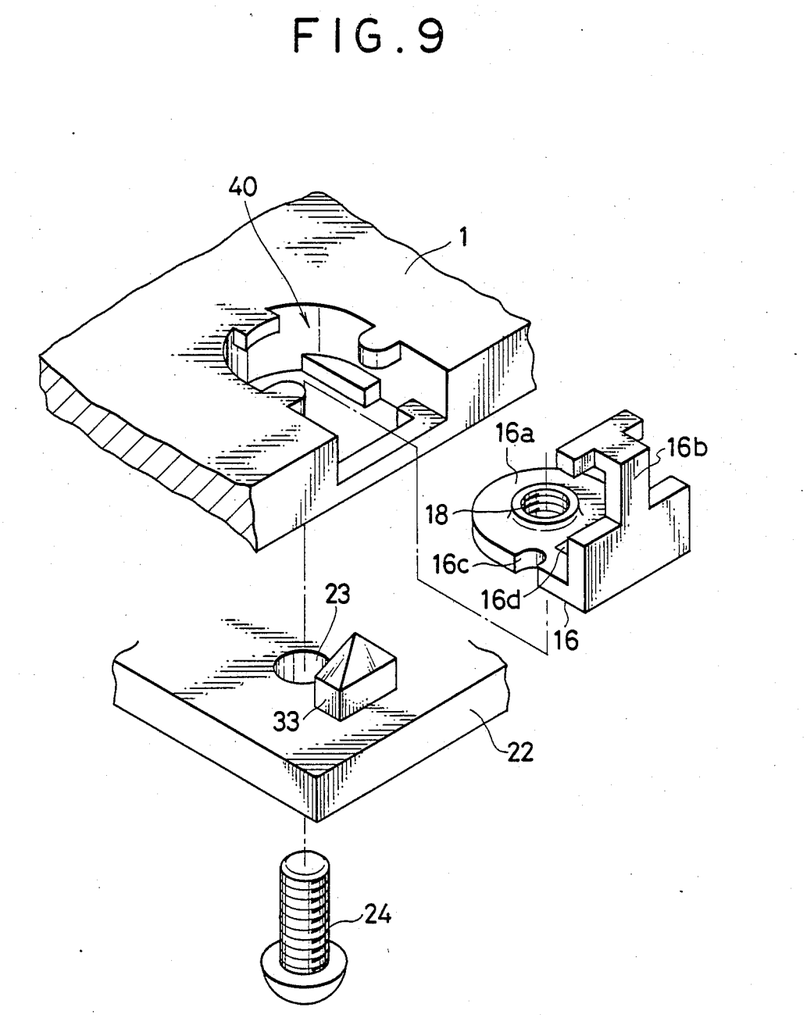
FIG. 9 is a perspective assembly view of the second embodiment of a terminal mounting device.

FIG. 9 shows an additional embodiment of the terminal mounting device according to the present invention, which has a concavity 40 for receiving the terminal 16 formed in the gauge support plate 1 without providing such a terminal holder as the first embodiment. The concavity 40 has the same construction as that of the cavity 19 of the first embodiment. Further, the terminal mounting device of this embodiment includes the same positioning regulating means as that of the first embodiment. Therefore, the mounting device thus formed can obtain substantially the same results as that of the terminal mounting device of the first embodiment by the provision of the gaps between the inner wall of the cavity and the outer periphery of the terminal and the positioning means consisting of the pin 33 on the meter body 22 and the notch 16d in the terminal 16. This is due to the fact that the twisting caused by the fastening force of the screw 24 can be absorbed by the gaps and a deviation between the gauge support plate 1 and the meter body 22 can be regulated by the positioning means.

Figure 10:
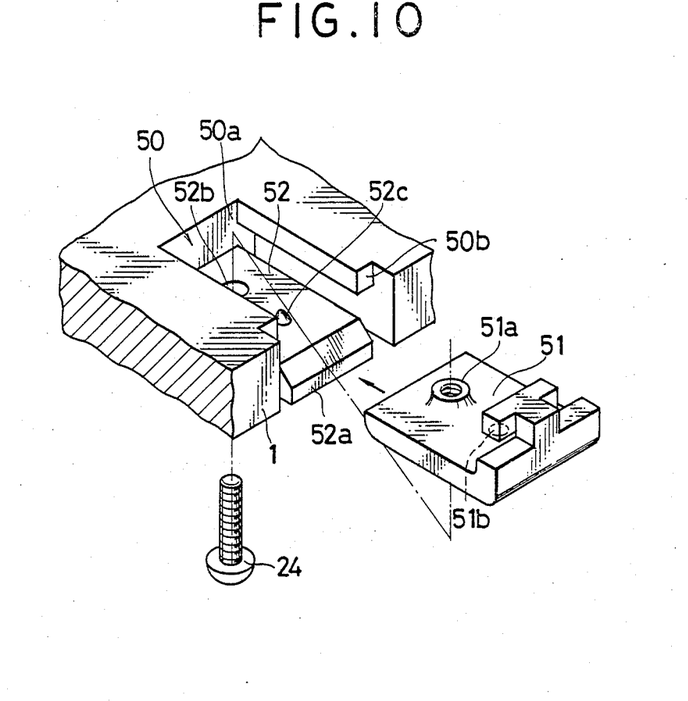
FIG. 10 is a perspective assembly view of the third embodiment of a terminal mounting device.

FIG. 10 shows an additional embodiment of the terminal mounting device according to the present invention, which comprises a U-shaped cavity 50 for receiving a terminal 51 formed in the gauge support plate 1. Said cavity 50 has a U-shaped inner wall 50a which defines the cavity 50. On the upper portions of both sides of the inner wall 50a, extending edge portions 50b which are formed integrally with the gauge support plate 1 are provided. The extending edge portions 50b are in contact with the upper surface of the terminal 51. On the other hand, on the under portion of the back side of the inner wall 50a, a tongue member 52 which has a rectangular shape is provided. Accordingly, in the cavity 50, there is formed a space between the extending edge portions 50a and the tongue member 52, in which the terminal 51 is mounted.

The tongue member 52 is formed by cutting both sides of a bottom surface of the cavity 50, so that the tongue member 52 is formed as an unitary body within the gauge support plate 1, whereby the tongue member 52 has elesticity. As a result, the terminal 51 is elasticity supported on the tongue member 52, so that, as described hereinafter, this tongue member 52 has a function which can be prevent an occurrence of a displacement and deformation in the gauge support plate 1. On the tip of the tongue member 52, there is provided an inclined surface 52a for making it easy to receive the terminal 51.

On the tongue member 52, there is provided a through hole 52b through which the screw 24 is inserted at the position corresponding to a screw fitting section 51a of the terminal 51. On the tongue member 52, there is also formed a projection 52c for positioning between the terminal 51 and the tongue member 52, which can be engaged with a hole 51b in the terminal 51. Under the gauge support plate 1, the meter body 22 and wiring board 25 are disposed in the same manner as the terminal mounting device of the first embodiment. Further, the screw 24 is inserted from the bottom of the wiring board 25, and fastened to the screw fitting section 51a of the terminal 51.

Figure 11A:
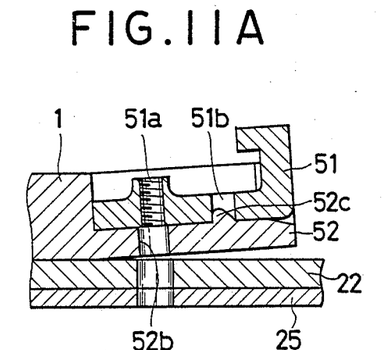
FIGS. 11A and 11B show different states in which the terminal mounting device of FIG. 10 is actually used.
Figure 11B:
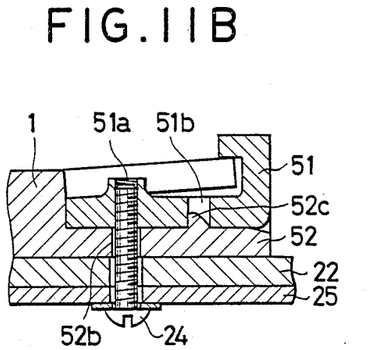

According to the terminal mounting device of this embodiment having the above-described construction, if a gap or deviation is present between the gauge support plate 1 and meter body 22 as shown in FIG. 11A, the tongue member 52 is easily bent due to its elasticity so as to absorb the gap and deviation as shown in FIG. 11B. Therefore, it is possible for the terminal mounting device to prevent an occurrence of a displacement and deformation in the gauge support plate which is caused by the presence of the gap and deviation and a fastening force of the screw.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A device for mounting a terminal to an electric indicator, comprising:
a meter body of the indicator having a through hole;
an electrical wiring board having a through hole, said electrical wiring board being disposed beneath said meter body;
a gauge support plate made of electrically insulating material disposed on said meter body, said gauge support plate having at least one concavity to which the terminal is mounted;
a screw for fastening the electrical terminal accommodated in the concavity via the through hole in the meter body;
means for preventing a deformation or displacement in said gauge support plate or the meter body caused by a fastening force of the screw or twisting force by said fastening of the screw, thereby preventing an occurrence of indication error in the indicator caused by the deformation or displacement.

2. A device for mounting a terminal to an electric indicator as set forth in claim 1, wherein said preventing means further comprises a terminal holder for receiving the electrical terminal therein, said terminal holder being made of electrically insulating material; a size of said terminal holder being smaller than that of said concavity so that said terminal is received within said concavity through a space therebetween; and at least one supporting means for suspensionally supporting the terminal holder within the concavity.

3. A device for mounting a terminal to an electric indicator as set forth in claim 2, wherein said supporting means is formed from an U-shaped elastic member which is provided within the space and connected between said terminal holder and said gauge support plate.

4. A device for mounting a terminal to an electric indicator as set forth in claim 3, wherein said support means are made from three U-shaped elastic members.

5. A device for mounting a terminal to an electric indicator as set forth in claims 3 or 4, wherein said elastic members are made of an electrically insulating material in a unitary body with the terminal holder and the gauge support plate.

6. A device for mounting a terminal to an electric indicator as set forth in claims 3 or 4, wherein said elastic members are made of a rubber.

7. A device for mounting a terminal to an electric indicator as set forth in claims 3 or 4, wherein said elastic members are springs.

8. A device for mounting an electrical terminal to an electric indicator as set forth in claim 2, wherein said terminal holder includes a cavity having a U-shaped wall which has a shape similar to the electrical terminal and defines the cavity to be relatively larger than the terminal so as to form a gap therebetween, and engaging means for preventing dropping of said terminal provided on the U-shaped wall, and said engaging means comprises a pair of notches each provided on side portions of the terminal and a pair of semi-spherical members each provided on the U-shaped wall, wherein said semi-spherical members are engaged with said notches with a gap, respectively, when the terminal is inserted into the cavity, whereby the terminal is located in the cavity through gaps between not only the periphery of the terminal and the periphery of the U-shaped wall of the cavity but also the semi-spherical members and the notches.

9. A device for mounting a terminal to an electric indicator as set forth in claim 8, wherein a width of these gaps is less than one-half of the diameter the screw.

10. A device for mounting a terminal to an electric indicator as set forth in claim 8, wherein a width of these gaps is less than one-half of the inner diameter of a screw fitting hole in the terminal.

11. A device for mounting a terminal to an electric indicator as set forth in claim 8, wherein said preventing means further comprises positioning means for regulating a positioning of the terminal, and said positioning means includes a pin provided on the meter body, and a notch provided in the electrical terminal so as to be in engagement with said pin.

12. A device for mounting a terminal to an electric indicator as set forth in claim 11, wherein said pin and notch have a rectangular shape in cross-section, respectively.

13. A device for mounting a terminal to an electric indicator as set forth in claim 8, wherein said supporting means is formed from an U-shaped elastic member whichis provided within the space and connected between said terminal holder and said gauge support plate.

14. A device for mounting a terminal to an electric indicator as set forth in claim 13, wherein said support means are made from three U-shaped elastic members.

15. A device for mounting a terminal to an electric indicator as set forth in claims 13 or 14, wherein said elastic members are made of an electrically insulating material in a unitary body with the terminal holder and the gauge support plate.

16. A device for mounting a terminal to an electric indicator as set forth in claims 13 or 14, wherein said elastic members are made of a rubber.

17. A device for mounting a terminal to an elastic indicator as set forth in claims 13 or 14, wherein said elastic members are springs.

18. A device for mounting a terminal to an electric indicator as set forth in claim 2, wherein said preventing means further comprises positioning means for regulating a positioning of the terminal, and said positioning means includes a pin provided on the meter body, and a notch provided in the electrical terminal so as to be in engagement with said pin.

19. A device for mounting a terminal to an electric indicator as set forth in claim 18, wherein said pin and notch have a rectangular shape in cross-section, respectively.

20. A device for mounting a terminal to an electric indicator as set forth in claim 1, wherein said preventing means further comprises a U-shaped wall having a shape similar to the terminal and defines the concavity to be relatively larger than the terminal so as to form a gap therebetween, and engaging means for preventing dropping of said terminal provided on the U-shaped wall, and said engaging means includes a pair of notches each provided on the side portions of the terminal and a pair of semi-spherical members each provided on the U-shaped wall, wherein said semi-spherical members are engaged with said notches with a gap, respectively, when the terminal is inserted in the concavity, whereby the terminal is located in the concavity through gaps between not only the periphery of the terminal and the periphery of the U-shaped wall but also the semi-spherical members and the notches.

21. A device for mounting a terminal to an electric indicator as set forth in claim 20, wherein a width of these gaps are less than one-half of the diameter of the screw.

22. A device for mounting a terminal to an electric indicator as set forth in claim 20, wherein a width of these gaps is less than one-half of the inner diameter of a screw fitting hole in the terminal.

23. A device for mounting a terminal to an electric indicator as set forth in claim 20, wherein said preventing means further comprises positioning means for regulating a positioning of the terminal, and said positioning means includes a pin provided on the meter body, and a notch provided in the electrical terminal so as to be in engagement with said pin.

24. A device for mounting a terminal to an electric indicator as set forth in claim 23, wherein said pin and notch have a rectangular shape in cross-section, respectively.

25. A device for mounting a terminal to an electric indicator as set forth in claim 1, wherein said preventing means further comprises positioning means for regulating a positioning of the terminal, and said positioning means includes a pin provided on the meter body, and a notch provided in the electrical terminal so as to be in engagement with said pin.

26. A device for mounting a terminal to an electric indicator as set forth in claim 25, wherein said pin and notch have a rectangular shape in cross-section, respectively.

27. A device for mounting a terminal to an electric indicator as set forth in claim 1, wherein said preventing means further comprises a U-shaped inner wall defining the concavity and having a back side, and a tongue member protrudingly and integrally provided on the back side of the inner wall of the concavity, said tongue member being formed in a rectangular shape and having a through hole for the screw, whereby the tongue member has elasticity which can absorb the deviation.

28. A device for mounting a terminal to an electric indicator as set forth in claim 27, wherein said concavity further comprises a bottom surface having opposed sides, and said tongue member is formed by cutting said opposed sides of the bottom surface of the concavity.

29. A device for mounting a terminal to an electric indicator as set forth in claims 27 or 28, wherein said tongue member has a tip edge portion, and an inclined surface is provided on the tip edge portion.

* * * * *